United States Patent
Orlowski et al.

(10) Patent No.: US 7,288,448 B2
(45) Date of Patent: Oct. 30, 2007

(54) METHOD AND APPARATUS FOR MOBILITY ENHANCEMENT IN A SEMICONDUCTOR DEVICE

(76) Inventors: Marius K. Orlowski, 10813 Redmond Rd., Austin, TX (US) 78739; Suresh Venkatesan, 5833 Taylor Draper Cove, Austin, TX (US) 78759

( * ) Notice: Subject to any disclaimer, the term of this patent is extended or adjusted under 35 U.S.C. 154(b) by 299 days.

(21) Appl. No.: 10/925,108

(22) Filed: Aug. 24, 2004

(65) Prior Publication Data
US 2006/0046366 A1  Mar. 2, 2006

(51) Int. Cl.
*H01L 21/336* (2006.01)
(52) U.S. Cl. .............. 438/198; 438/197; 438/285; 438/299; 438/300
(58) Field of Classification Search ............... None
See application file for complete search history.

(56) References Cited

U.S. PATENT DOCUMENTS

| | | | |
|---|---|---|---|
| 5,849,440 A | 12/1998 | Lucas et al. | |
| 5,858,830 A | 1/1999 | Yoo et al. | |
| 6,103,020 A | 8/2000 | Roberts et al. | |
| 6,197,632 B1 | 3/2001 | Bronner et al. | |
| 6,541,382 B1 | 4/2003 | Cheng et al. | |
| 6,605,498 B1 | 8/2003 | Murthy et al. | |
| 6,621,131 B2 | 9/2003 | Murthy et al. | |
| 2005/0285187 A1* | 12/2005 | Bryant et al. | ............... 257/335 |

FOREIGN PATENT DOCUMENTS

WO      WO02/45156 A2     6/2002

OTHER PUBLICATIONS

Ouyang, Qiqing Christine et al., "Built-in Longitudinal Field Effects in Sub-100-nm Graded $Si_{1-x}Ge_x$ Channel PMOSFETs"; IEEE Transactions on Electron Devices, Jun. 2001, vol. 48, No. 6, pp. 1245-1250.

(Continued)

*Primary Examiner*—Sue A. Purvis
*Assistant Examiner*—Fazli Erdem
(74) *Attorney, Agent, or Firm*—James L. Clingan, Jr.; Daniel D. Hill

(57) ABSTRACT

A method and apparatus is presented that provides mobility enhancement in the channel region of a transistor. In one embodiment, a channel region (18) is formed over a substrate that is bi-axially stressed. Source (30) and drain (32) regions are formed over the substrate. The source and drain regions provide an additional uni-axial stress to the bi-axially stressed channel region. The uni-axial stress and the bi-axial stress are both compressive for P-channel transistors and both tensile for N-channel transistors. The result is that carrier mobility is enhanced for both short channel and long channel transistors. Both transistor types can be included on the same integrated circuit.

14 Claims, 4 Drawing Sheets

OTHER PUBLICATIONS

Gannavaram, Shyam et al.; "Low Temperature (≦800° C) Recessed Junction Selective Silicon-Germanium Source/Drain Technology for sub-70 nm CMOS," IEEE, IEDM 2000, pp. 18.3.1-18.3.4.

Öztürk, M.C. et al.; "Ultra-Shallow Source/Drain Junctions for Nanoscale CMOS Using Selective Silicon-Germanium Technology," Extended Abstracts of International Workshop on Junction Technology, 2001, pp. 5-1-1 thru 5-1-6.

Streit, Dwight C. et al., "High Performance HBT's with Built-in Base Fields: Exponentially-Graded Doping vs Graded Composition," Proceedings IEEE/Cornell Conference on Advanced Concepts in High Speed Semiconductor Devices and Circuits, Aug. 5-7, 1991, pp. 325-333.

Ghani et al., "A 90nm High Volume Manufacturing Logic Technology Featuring Novel 45nm Gate Length Strained Silicon CMOS Transistor," IEEE, 2003, 3 pgs.

Sleight et al., Stress Induced Defects and Transistor Leakage for Shallow Trench Isolated SOI, *IEEE Electron Device Letters*, vol. 20, No. 5, May 1999, pp. 248-250.

Lander et al., "High Hole Mobilities in Fully-Strained $Si_{1-x}Ge_x$ Layers (0.3<x<0.4) and Their Significance for SiGe pMOSFET Performance," IEEE Transactions on Electron Devices, vol. 48, No. 8, Aug. 2001, pp. 1826-1832.

Ernst et al., "A New Si:C Epitaxial Channel nMOSFET architecture With Improved Drivability And Short-Channel Characteristics," 2003 IEEE Symposium on VLSI Technology Digest of Technical Papers, pp. 51-52.

Shima et al., "<100> Channel Strained-SiGe p-MOSFET With Enhanced Hole Mobility and Lower Parasitic Resistance," 2002 Symposium on VLSI Technology Digest of Technical Papers, pp. 94-95.

* cited by examiner

METHOD AND APPARATUS FOR MOBILITY ENHANCEMENT IN A SEMICONDUCTOR DEVICE

RELATED APPLICATIONS

U.S. patent application Docket No. SC13390, titled "Method and Apparatus for Performance Enhancement in an Asymmetrical Semiconductor Device," assigned to the assignee hereof, and filed concurrently herewith.

FIELD OF THE INVENTION

This invention relates to semiconductor devices, and more particularly, to semiconductor devices that have enhanced mobility.

RELATED ART

In the manufacture of semiconductor devices, silicon has been by far the most popular choice for the semiconductor material. Transistor performance has been enhanced regularly through a variety of process improvements. One of the improvements has been to alter the stress in the silicon in order to improve mobility. Some of the techniques have included using other materials in addition to the silicon to bring about the stress and the consequent mobility improvement. For example, a silicon layer that has germanium added results in a silicon germanium layer that is under compressive stress. Such a silicon germanium layer under compressive stress is useful in improving the mobility of the carriers for a P channel transistor. Finding ways to create tensile stress is for improving the carriers for an N channel transistor.

A variety of techniques have been developed for achieving both tensile and compressive stresses. The mobility improves with increases in stress but ultimately, enough increase in stress causes fractures or extended defects in the crystal lattice, which renders it useless for semiconductor manufacturing. Another issue is that a typical stress enhancing technique is useful in improving mobility in only one of either short channel or long channel transistors. For example, the typical problem with a bi-axial compressive stress in SiGe is that it does little to improve the mobility of carriers in a short channel transistor. On the other hand, the typical problem with a uni-axial stress is that it does little to improve mobility of carriers in a long channel transistor. Thus, the mobility enhancements cause changes in mobility with changes in channel length, which makes it more difficult to provide models for the transistors, which in turn makes it more difficult to design circuits using transistors with these mobility enhancements.

Thus, there is a need to provide mobility enhancements that improve on one or more of the problems noted above.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, transistors have enhanced carrier mobility by having the channel region under both a uni-axial stress and a bi-axial stress. The result is that mobility is enhanced for both short and long channel transistors and difference in mobility between the long channel and short channel transistors is lessened. This is better understood by reference to the figures and the following description.

Figure 1:
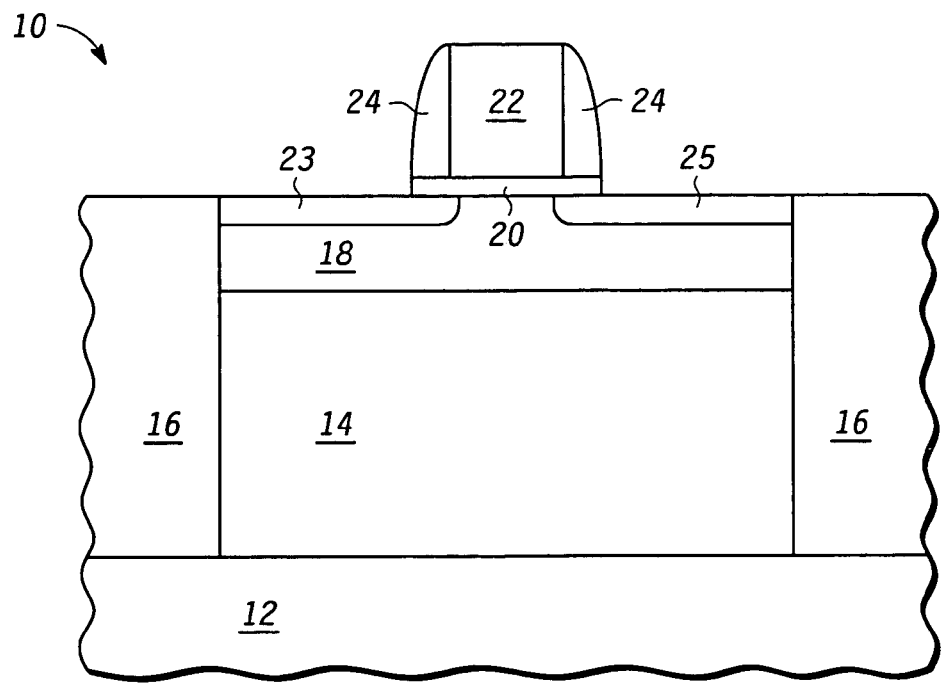
FIG. 1 is a cross section of a semiconductor structure at a first stage in processing according to a first embodiment of the invention.

Shown in FIG. 1 is a semiconductor structure 10 comprising a an insulating layer 12, a semiconductor layer 14 on insulating layer 12, a trench isolation 16 over insulating layer 12 and surrounding semiconductor layer 14, a semiconductor layer 18 on semiconductor layer 14, a gate dielectric 20, over a gate 22, a sidewall spacer 24 around gate 24, a source/drain extension region 23 on one side of gate 22, and a source/drain extension 25 on another side of gate 22. Semiconductor layer 18 is epitaxially grown on semiconductor layer 14. Thus semiconductor layer 18 matches the crystalline structure and the crystal spacing of semiconductor layer 14. Due to the forced matching of the crystal spacing due to the epitaxial growth, the change in material between semiconductor layers 14 and 18 causes a stress change between the two.

For the N channel case, semiconductor layer 14 is preferably silicon and semiconductor layer 18 is preferably a silicon carbon alloy. The silicon is preferably relaxed with the result that the silicon carbon alloy is under bi-axial tensile stress. In the alternative, semiconductor layer 14 may be at least partially relaxed silicon germanium and semiconductor layer 18 can be either silicon or silicon carbon alloye either which would be under bi-axial tensile stress. In either of these examples for the N channel case, semiconductor layer 14 has an intrinsic crystal lattice constant that is larger than the intrinsic lattice constant of the subsequently epitaxially grown semiconductor layer 18.

For the P channel case, semiconductor layer 14 is preferably silicon and semiconductor layer 18 is preferably silicon germanium. The silicon may be relaxed with the result that the silicon germanium is under bi-axial compressive stress. In the alternative, semiconductor layer 14 may be another semiconductor material on which can be grown semiconductor layer 18 to be under bi-axial compressive stress. In this example for the P channel case, semiconductor layer 14 has an intrinsic crystal lattice constant that is smaller than the intrinsic lattice constant of the subsequently epitaxially grown semiconductor layer 18.

Figure 2:
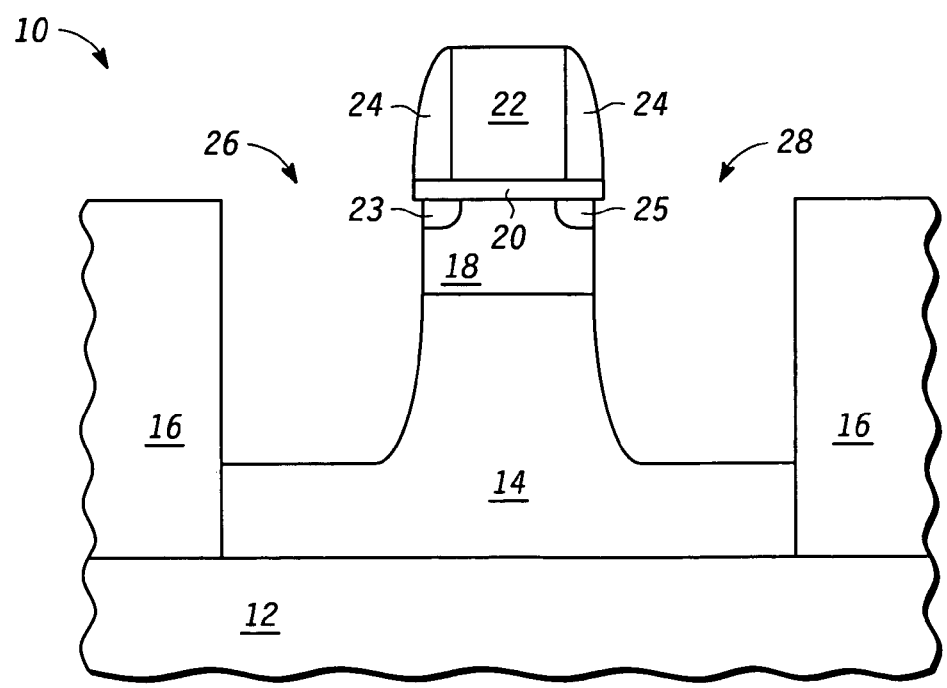
FIG. 2 is a cross section of the semiconductor structure of FIG. 1 at a subsequent stage in processing.

Shown in FIG. 2 is semiconductor structure 10 after etching source/drain extensions 23 and 25, semiconductor layer 18, and semiconductor layer 14, to leave a recess 26 on the one side of gate 22 and a recess 28 on the other side of gate 22.

Figure 3:
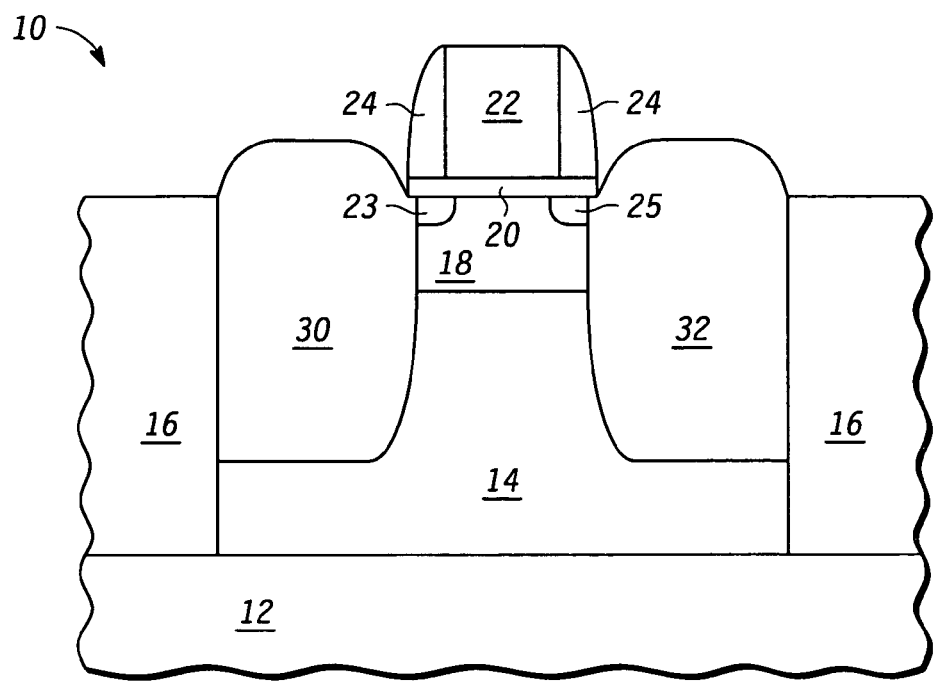
FIG. 3 is a cross section of the semiconductor structure of FIG. 2 at a subsequent stage in processing.

Shown in FIG. 3 is semiconductor structure 10 after filling recesses 26 and 28 with a semiconductor fill 30 and a semiconductor fill 32, respectively. Semiconductor fills 30 and 32 can be in situ doped or doped by implant to become source/drain regions. The material for semiconductor fills 30 and 32 is the same as the material type for semiconductor layer 18 but may have a different ratio of the elements thereof. For example, for the N channel case, the semiconductor material in regions 30 and 32 may be silicon carbon alloye for the case in which semiconductor layer 18 is silicon carbon alloye, but the ratio of silicon to carbon may be different. The silicon carbon alloye case creates a uni-axial tensile stress in semiconductor layer 18. Similarly for the P channel case, semiconductor fills 30 and 32 may be silicon germanium for the case in which semiconductor layer is silicon germanium but the ratios of silicon to germanium may be different. The silicon germanium case creates a uni-axial compressive stress in semiconductor layer 18. Semiconductor fills 30 and 32 are stressors that can provide either compressive or tensile stress, depending on the material, that is uni-axial.

The resulting semiconductor device 10 of FIG. 3 thus has a semiconductor region 18 that is used as channel that is under both uni-axial stress and bi-axial stress. Thus mobility is enhanced for both long channel and short channel. By adjusting the amount of stress of each type, the mobility can be held much closer to being the same for both the long and short channel cases.

Figure 4:
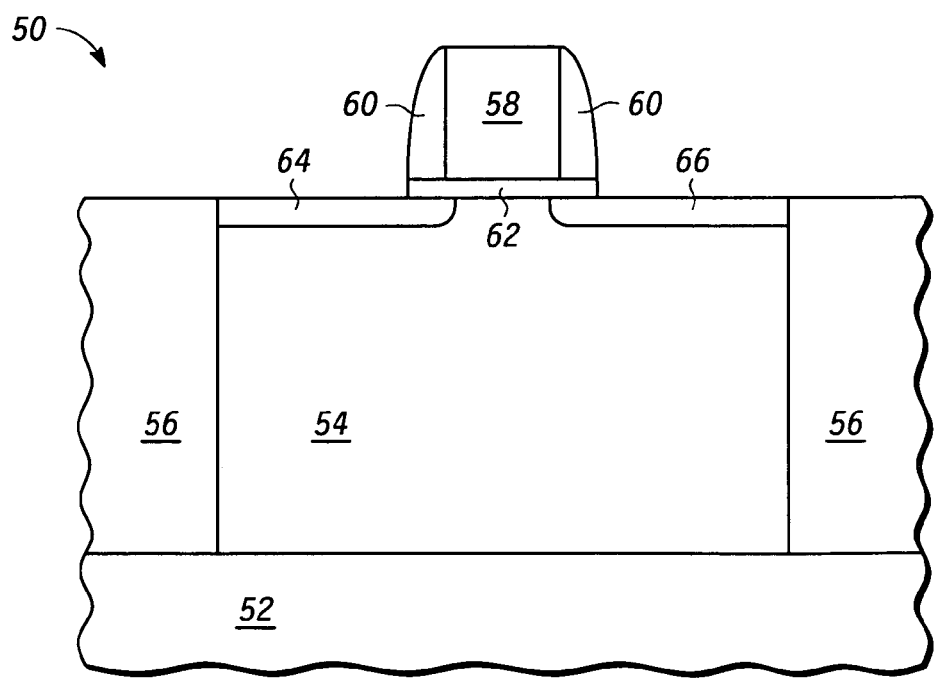
FIG. 4 is a cross section of a semiconductor structure at a first stage in processing according to a second embodiment of the invention.

Shown in FIG. 4 is a semiconductor structure 50, comprising an insulating layer 52, a semiconductor layer 54 of silicon germanium that is partially relaxed on insulating layer 52, a trench isolation 56 surrounding semiconductor layer 54, a gate dielectric 62 on semiconductor layer 54, a gate on gate dielectric 62, a sidewall spacer 60 surrounding gate 58, a source/drain extension 64 in semiconductor layer 54 on one side of gate 58, and a source/drain extension 66 in semiconductor layer 54 on another side of gate 58. This structure is for a P channel transistor because partially relaxed silicon germanium provides enhanced hole mobility due to its bi-axial compressive stress.

Figure 5:
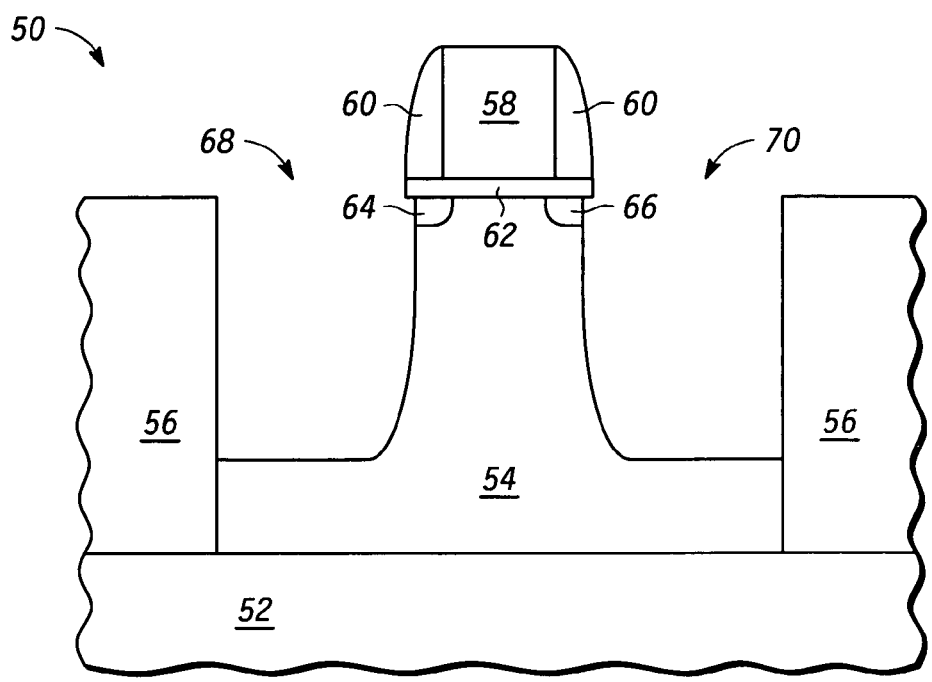
FIG. 5 is a cross section of the semiconductor structure of FIG. 4 at a subsequent stage in processing.

Shown in FIG. 5 is semiconductor structure 50 after etching through source/drain extensions 64 and 66 and into semiconductor layer 54, to leave a recess 68 on the one side of gate 58 and a recess 70 on the other side of gate 58.

Figure 6:
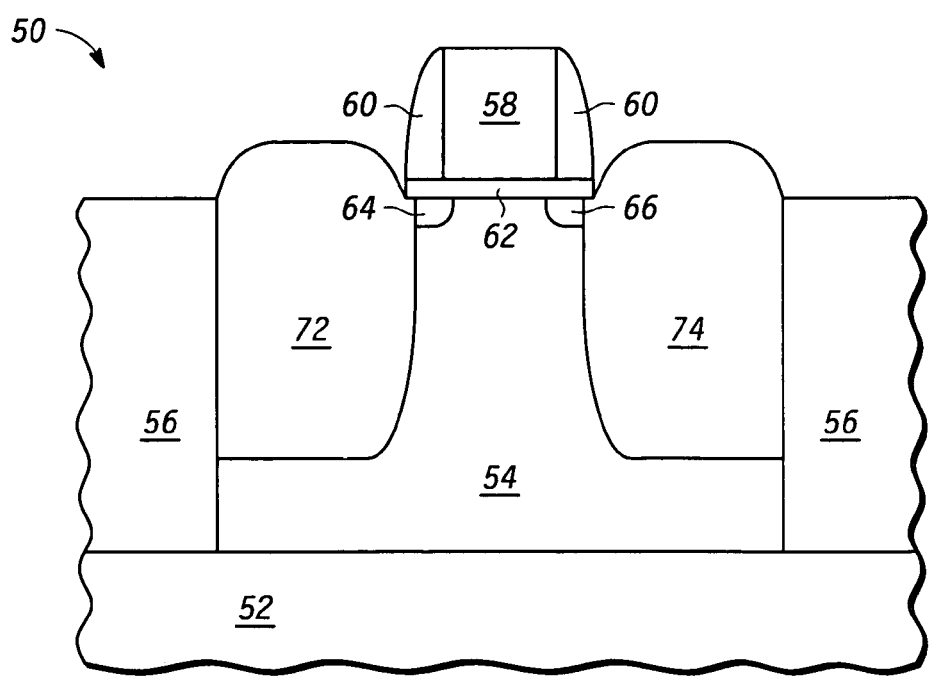
FIG. 6 is a cross section of the semiconductor structure of FIG. 6 at a subsequent stage in processing.

Shown in FIG. 6 is semiconductor structure 50 after filling recesses 68 and 70 with a semiconductor fill 72 and a semiconductor fill 74, respectively. The material for semiconductor fills 72 and 74 is the same as the material type for semiconductor layer 54 but may have a different ratio of the elements thereof. Thus in this example in which semiconductor layer 54 is silicon germanium, the ratio of silicon to germanium in semiconductor fills 72 and 74 may be different than for semiconductor layer 54. Semiconductor fills 72 and 74 can be in situ doped or doped by implant to become source/drain regions. In this semiconductor device 50, semiconductor layer 54, as partially relaxed silicon germanium, has a bi-axial compressive stress and further there is applied an additional compressive stress that is uni-axial 1 through the formation of semiconductor fills 72 and 74. The result is a device structure that has both uni-axial and bi-axial stress. In this case, it is a compressive stress that is useful for P channel transistors, but with different semiconductor materials it could be a tensile stress that would be useful for N channel transistors.

Figure 7:
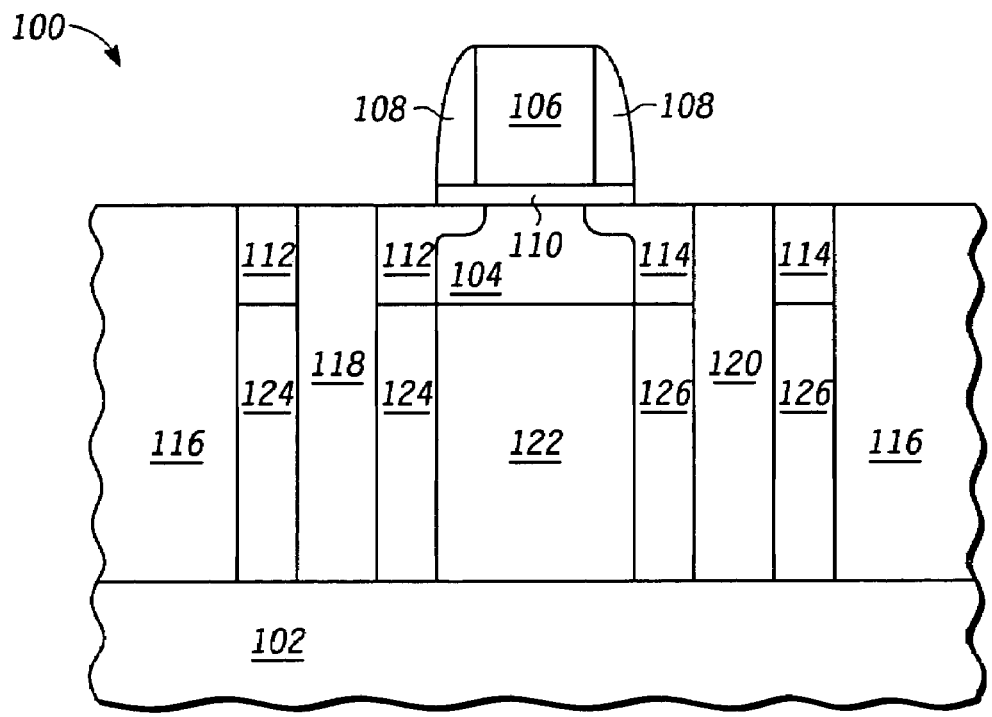
FIG. 7 is a cross section semiconductor structure according to an alternative in using the invention.

Shown in FIG. 7 is a semiconductor device 100 comprising an insulating layer 102, a semiconductor body 122 on insulating layer 102, a semiconductor body 104 on semiconductor body 122, a trench isolation 116 surrounding semiconductor bodies 122 and 104, a gate dielectric 110 on semiconductor body 104, a gate 106 on gate dielectric 110, a sidewall spacer 108 surrounding gate 106, a source/drain region 124 in semiconductor body 122 on one side of gate 106, a source/drain region 126 in semiconductor body 122 on the other side of gate 106, a source/drain region 112 in semiconductor body 104 on the one side of gate 106, a source/drain region 114 in semiconductor body 104 on the other side of gate 106, an insulator plug 118 spaced from gate 106 and through source/drain regions 112 and 124 to insulating layer 102, and an insulator plug 120 spaced from gate 108 and through source/drain regions 114 and 126.

For the P channel case, semiconductor layer 122 is preferably silicon and semiconductor layer 104 is preferably silicon germanium. The silicon may be relaxed with the result that the silicon germanium is under compressive stress. In the alternative, semiconductor layer 122 may be another semiconductor material on which can be grown semiconductor layer 104 to be under compressive stress.

Figure 8:
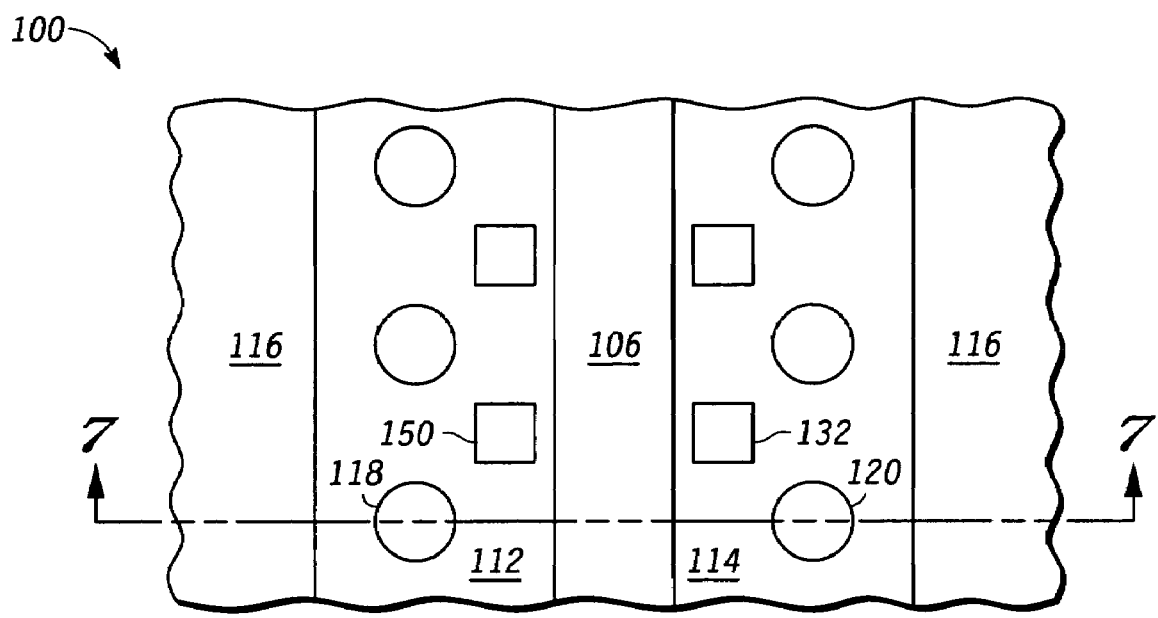
FIG. 8 is a top view of the semiconductor structure of claim 7.

Shown in FIG. 8 is a top view of semiconductor device 100 and showing where the cross section for FIG. 7 is taken. This shows insulator plug 118 through source/drain region 112 and that there are plurality of such insulation plugs on the one side of gate 106 between gate 106 and trench isolation 116. Similarly there is shown insulator plug 120 on the other side of gate 106 and that there are a plurality of such insulator plugs through source/drain region 114. These isolation plugs, which are stressors, are formed at the same time and in the same way as trench isolation 116. This is achieved by an oxide liner and an oxide, such as TEOS, fill. Squares 132 and 150 denote contacts of the source/drain regions placed between isolation plugs 114 and 120. There is a plurality of such contacts to lower the contact resistance between the outside interconnects and the source/drain regions. This semiconductor device 100 is an alternative approach for providing a uni-axial stress. In this case the uni-axial stress is a compressive stress in semiconductor body 104.

In the foregoing specification, the invention has been described with reference to specific embodiments. However, one of ordinary skill in the art appreciates that various modifications and changes can be made without departing from the scope of the present invention as set forth in the claims below. For example, a technique for obtaining uni-axial stress was described in FIGS. 1-6 but other alternatives may also be used such as that shown in FIGS. 7 and 8. Further, it is possible to introduce an additional element into the lattice structure to achieve a different dopant characteristic. For example, for the N channel case, Ge may be introduced. This would tend to reduce the tensile stress but that can be compensated for by increasing the carbon compared to the silicon. In such case the source/drain should be in further tensile stress so that the carbon to germanium would need to be increased beyond that for the channel. The effect is to increase the carbon concentration for a given tensile stress. The increase in carbon has the effect of reducing the boron diffusion rate. Similarly for the P channel transistors, carbon can be added to the channel which in turn will require an increase in Ge. A further increase in Ge would beneficial for the source/drains. The effect of increasing the Ge concentration to maintain the same compressive stress is to increase the rate of diffusion of Arsenic. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for a transistor, comprising:
providing a substrate;
forming a channel region over the substrate that is bi-axially stressed; and
forming source and drain regions over the substrate, the source and drain regions providing a uni-axial stress to the channel region;
forming a first layer comprising silicon on the substrate, the first layer having a first intrinsic lattice constant; and
epitaxially growing a second layer on the first layer, the second layer comprising silicon and another element, the second layer having a second intrinsic lattice constant that is larger than the first intrinsic lattice constant.

2. The method of claim 1, wherein the another element is germanium.

3. The method of claim 1, wherein the transistor is a P-channel transistor.

4. The method of claim 1, wherein both the bi-axial stress and the un-axial stress are compressive stress.

5. A method for a transistor, comprising:
providing a substrate;
forming a channel region over the substrate that is bi-axially stressed; and
forming source and drain regions over the substrate, the source and drain regions providing a uni-axial stress to the channel region;
forming a first layer comprising silicon on the substrate, the first layer having a first intrinsic lattice constant; and
epitaxially growing a second layer on the first layer, the second layer comprising silicon and another element, the second layer having a second intrinsic lattice constant that is smaller than the first intrinsic lattice constant.

6. The method of claim 5, wherein the another element is carbon.

7. The method of claim 5, wherein the transistor is an N-channel transistor.

8. The method of claim 5, wherein forming a channel region further comprises:
forming a bi-axially stressed layer comprising silicon and germanium over the substrate;
forming a gate oxide over the bi-axially stressed layer; and
forming a gate over the gate oxide.

9. The method of claim 5, wherein both the bi-axial stress and the uni-axial stress are tensile stress.

10. The method of claim 5, wherein the substrate is a semiconductor substrate.

11. A method for forming a transistor, comprising:
providing a substrate;
forming a channel region over the substrate that is bi-axially stressed; and
forming source and drain regions over the substrate, the source and drain regions providing a uni-axial stress to the channel region;
forming a first layer comprising silicon over the substrate;
forming source and drain extensions in the first layer;
removing a predetermined amount of the first layer from the source and drain extensions to form source and drain recesses; and
epitaxially growing a first stressor in the source region and a second stressor in the drain region, the first and second stressors comprising silicon and germanium, the first and second stressors for providing the uni-axial stress to the channel region.

12. The method of claim 11, wherein the channel region is bi-axially stressed along a plane of the transistor.

13. A method for forming a transistor, comprising:
providing a substrate;
forming a channel region over the substrate that is bi-axially stressed; and
forming source and drain regions over the substrate, the source and drain regions providing a uni-axial stress to the channel region;
wherein the channel region comprises silicon and germanium and the source and drain regions each comprise silicon and germanium, wherein a germanium content of the source and drain regions is higher than a germanium content of the channel region.

14. A method for forming a transistor, comprising:
providing a substrate;
forming a channel region over the substrate that is bi-axially stressed; and
forming source and drain regions over the substrate, the source and drain regions providing a uni-axial stress to the channel region;
wherein the channel region comprises silicon and carbon and the source and drain regions each comprise silicon and carbon, wherein a carbon content of the source and drain regions is higher than a carbon content of the channel region.

* * * * *